(12) United States Patent
Mattes et al.

(10) Patent No.: US 6,396,427 B1
(45) Date of Patent: May 28, 2002

(54) CIRCUIT ARRANGEMENT FOR MEASURING THE DECELERATION OF A VEHICLE, CAUSED BY A PRE-CRASH BRAKING PROCEDURE

(75) Inventors: Bernhard Mattes, Sachsenheim (DE); Gerhard Mehler, Bénouville (FR)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/701,350
(22) PCT Filed: Apr. 6, 2000
(86) PCT No.: PCT/EP00/03052
§ 371 (c)(1), (2), (4) Date: Nov. 28, 2000
(87) PCT Pub. No.: WO00/63046
PCT Pub. Date: Oct. 26, 2000

(30) Foreign Application Priority Data

Apr. 15, 1999 (DE) .......................... 199 16 954

(51) Int. Cl.$^7$ ................................ H03M 1/62
(52) U.S. Cl. ............... 341/139; 701/45; 364/424.05
(58) Field of Search ............... 341/139, 155, 341/156, 120, 116, 118; 303/97; 364/424.03, 424.05, 424.055

(56) References Cited

U.S. PATENT DOCUMENTS

| 5,083,276 A | 1/1992 | Takeuchi |
| 5,216,607 A | * 6/1993 | Diller et al. ............ 364/424.05 |
| 5,381,334 A | * 1/1995 | Furui ..................... 364/424.03 |
| 5,425,574 A | * 6/1995 | Sano ........................... 303/97 |
| 5,668,723 A | * 9/1997 | Blackburn ............ 364/424.055 |

FOREIGN PATENT DOCUMENTS

| DE | 195 35 633 A1 | 3/1996 |
| EP | 0 402 027 A | 12/1990 |

OTHER PUBLICATIONS

Tangusngband Des 3–rd International Symposium on Sophisticated Car Occupant Safety Systems, Airbags 2000, Nov. 16–27, 1996, Karlsruhe, Seite 16–1 Bis 15–20.

DE–Z: Elektronik 17/1996, pp. 80–83.

* cited by examiner

*Primary Examiner*—Brian Young
*Assistant Examiner*—John Nguyen
(74) *Attorney, Agent, or Firm*—Michael J. Striker

(57) ABSTRACT

A circuit arrangement, attainable with simple switching means, for measuring decelerations of a vehicle that, caused by a braking operation occurring before a crash, lead to a change in the seat position of the vehicle occupants, comprises measuring the deceleration with an acceleration sensor (BS), which is designed to detect high decelerations occurring in a crash, and the presence of an amplifier (OP), which amplifies the output voltage (UO) of the sensor (BS), ascribed to low decelerations, so that the digital measurement signal (MS) derived from the amplified output voltage (UOV) by an analog/digital converter (AD) has adequately high resolution of the decelerations.

2 Claims, 1 Drawing Sheet

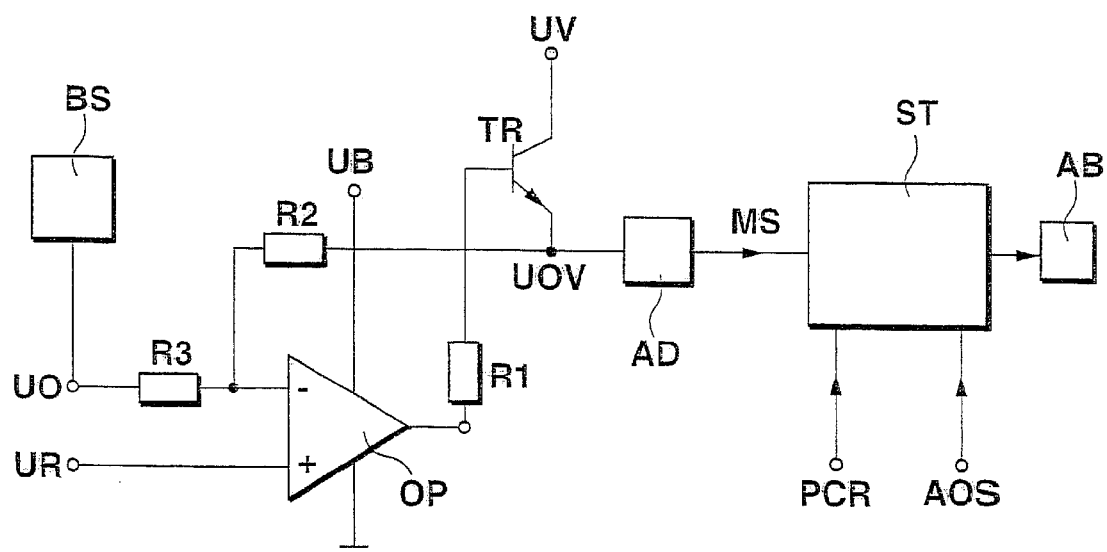

CIRCUIT ARRANGEMENT FOR MEASURING THE DECELERATION OF A VEHICLE, CAUSED BY A PRE-CRASH BRAKING PROCEDURE

PRIOR ART

The present invention relates to a circuit arrangement for measuring decelerations of a vehicle which, caused by a braking operation occurring before a crash, lead to a change in the seat position of vehicle occupants, wherein an analog/digital converter converts the analog output voltage of an acceleration sensor for an ensuing signal evaluation into a digital measurement signal.

From the Proceedings of the 3rd International Symposium on Sophisticated Occupant Safety Systems, Airbag 2000, 1996, November 26/27, Karlsruhe, Germany, pages 16-1 through 15–20, it is known, using so-called precrash sensors, with which the distance or relative speed of the vehicle relative to an obstacle can be ascertained on the basis of radar, infrared radiation, or ultrasound, to make a prediction whether a crash of the vehicle and an obstacle is imminent. This reference also describes an interior sensor which detects the positions of a vehicle occupant on his seat by infrared radiation and ultrasound. Depending on the position of the vehicle cccupants, the tripping of an airbag, or in other words the intensity of its inflation, is controlled such that the occupant is given optimal protection in a vehicle crash. If the vehicle occupant is in what is called an out-of-position location in which the tripping of an airbag could be too dangerous to the occupant, the airbag is deactivated.

Experience teaches that the driver of a vehicle, before a natural crash occurs, initiates a braking operation. This braking operation, also known as precrash braking, means that above all an occupant on the front passenger seat is shifted forward toward the front passenger airbag. From the deceleration that the vehicle undergoes as a result of such a braking operation before a crash, in cooperation with the interior sensor, the positional shift of the occupant can be detected in good time before the ensuing crash, so that an activation or deactivation of the airbag can be initiated accordingly.

The object of the invention is now to disclose a circuit arrangement for measuring decelerations of a vehicle that— caused by a braking operation occurring before a crash— lead to a change in the seat position of vehicle occupants, which is feasible with the simplest possible switching means.

ADVANTAGES OF THE INVENTION

This object is attained with the characteristics of claim in that the output signal of an acceleration sensor, once it has been converted by an analog/digital converter into a digital measurement signal, is evaluated. As the acceleration sensor, a sensor design to detect high decelerations that occur in a crash is used. An amplifier is provided, which amplifies the sensor output voltage, ascribed to low decelerations, so that the digital measurement signal derived from the amplified output voltage by the analog/digital converter has an adequately high resolution of the decelerations.

According to the invention, to detect a braking operation occurring before a crash, an acceleration sensor that is present in the vehicle anyway is accordingly used; it is actually intended to measure high accelerations, occurring in a natural crash, in the longitudinal direction of the vehicle that are up to 35 times the acceleration due to gravity, or g.

The invention makes it possible for a sensor, intended intrinsically to measure very accelerations, to be utilized as well to detect low decelerations (0.1 g to 1 g), of the kind that occur in precrash braking operations, and the measurement signal has adequately high resolution for the low decelerations.

Advantageous refinements of the invention are defined by the dependent claims. Accordingly, switching means can be connected to the amplifier, which limit or convert the rise of the amplifier output voltage to the voltage range that the analog/digital converter is capable of converting. The amplifier can for instance be an operational amplifier, at whose output a transistor is connected as a collector circuit, which sets an upper limit to the rise of the output voltage of the operational amplifier to the voltage range that the analog/digital converter is capable of converting and extends it downward to near the ground potential. An inexpensive bipolar operational amplifier can thus be used, which has relatively high output saturation voltages, so that even so, high resolution of the acceleration measurement signal can be attained.

DESCRIPTION OF AN EXEMPLARY EMBODIMENT

The invention will be described in further detail below in conjunction with an exemplary embodiment shown in the drawing.

In the sole figure of the drawing, a circuit arrangement is shown with which decelerations of a vehicle, which caused by a braking operation occurring before a crash of the vehicle cause a change in the seat position of the vehicle occupants, can be measured. The circuit arrangement measures the deceleration of the vehicle, and a control unit ST, which is responsible for the activation of one or more airbags AB and other restraint devices, evaluates the measured deceleration signal MS together with precrash information PCR and the information AOS from an interior sensor. If information PCR about an imminent crash comes from a precrash sensor, or if the driver recognizes an approaching obstacle, then a subsequently measured deceleration MS of the vehicle can be ascribed with high probability to a braking operation that the driver has initiated in view of the imminent crash. This deceleration causes a shift of the occupants out of their ideal position, so that the control unit ST accordingly brings about a triggering of restraint means that is suitable to protect the vehicle occupants. Depending on the location AOS of the vehicle occupants that is detected by an interior sensor, airbags can be inflated more or less markedly or in stages, or airbag tripping can be suppressed if the affected person has undergone a shift forward too close to the airbag.

For the detecting the vehicle deceleration in a braking operation before a crash (precrash braking), at least one acceleration sensor BS is used, which is intrinsically intended to measure the vehicle decelerations or accelerations in the longitudinal direction of the vehicle that occur in a crash. This acceleration sensor BS must be capable of detecting very high accelerations, up to 35 g (g=acceleration due to gravity), of the kind that occur in crash situations. Although in precrash braking considerably lesser decelerations, namely from 0.1 g to 1 g, occur than in a natural crash, the acceleration sensor BS designed to detect high acceleration values is used. An acceleration sensor BS that is designed to measure decelerations of up to 35 g for instance has a measurement sensitivity of 55 mV/g. If an 8-bit analog/digital converter is supplied for converting the analog output voltage of the acceleration sensor into a digital measurement signal to be processed by the control unit ST, the result is a resolution of approximately 0.36 g/bit for the measurement signal. This resolution of the measurement signal is much too slight for detecting low decelerations of between 0.1 and 1 g. In order nevertheless to achieve better measurement signal resolution with an 8-bit analog/digital converter AD, an operational amplifier OP is provided, to one input of which the output voltage UO of the acceleration sensor BS and to the other input which a reference voltage UR is applied. By the amplification of the output signal UO, whose measurement sensitivity is 55 m/Vg, by the factor of 10=[paste in], for instance, the result is an acceleration measurement voltage UOV which can be converted with the adjoining 8-bit analog/digital converter into a digital measurement signal MS of adequately high resolution.

The rise of the voltage UOV supplied to the analog/digital converter AD should be within the voltage range that the analog/digital converter AD is capable of processing, and in no case should it exceed or undershoot the maximum possible input voltage of the analog/digital converter, because otherwise the analog/digital converter would incorrectly convert all the voltage values UOV applied. If an inexpensive bipolar operational amplifier is used, it is not necessarily assured that its output voltage rise will not exceed the allowable input voltage rise of the analog/digital converter. Inexpensive operational amplifiers exist (such as the LM2904), which for example has an output voltage rise from ground potential +1.5 V to the supply voltage UB −2 V. If the supply voltage UB of the operational amplifier is 8 V, the output voltage rise accordingly reaches an upper limit of 6 V. However, if the input voltage rise of the analog/digital converter AD is only up to 5 V, then the conversion range of the analog/digital converter AD would be exceeded by the output voltage of the operational amplifier OP. To avoid this, a transistor TR as a collector circuit is connected to the output of the operational amplifier OP. This transistor TR, whose bias voltage UV=5 V, effects a limitation in the rise of the output voltage of the operational amplifier OP by a base-to-collector diode clamp to 5 V, so that the input voltage UOV of the analog/digital converter, which is applied to the emitter of the transistor TR, will not exceed the upper value, 5 V, of the conversion range. The output of the operational amplifier OP is connected via a resistor R1 to the base of the transistor TR, and the emitter of the transistor TR is connected, via a negative-feedback resistor R2, to the input of the operational amplifier OP at which the output voltage UO of the acceleration sensor BS is located.

The zero-g offset of the acceleration sensor BS and of the following amplifier OP is not considered in ascertaining the measurement signal MS and is not taken into account until the formation of tripping criteria in the control unit ST.

What is claimed is:

1. A circuit arrangement for measuring decelerations of a vehicle which, caused by a braking operation occurring before a crash, cause a change in the seat position of the vehicle occupants, wherein an analog/digital convert (AD) converts the analog output voltage of an acceleration sensor (BS) for an ensuing signal evaluation into a digital measurement signal (MS), characterized in that the acceleration sensor (BS) is designed to detect high decelerations occurring in a crash, and that an amplifier (OP) is provided for amplifying the output voltage (UO) of the sensor (BS), wherein said voltage is ascribed to low decelerations, so that the digital measurement signal (MS) derived from the amplified output voltage (UOV) from the analog/digital converter (AD) has adequately high resolution of the decelerations, wherein switching means (TR) are connected to the amplifier (OP), said switching means (TR) adapting a rise of the amplifier output voltage to a voltage range that the analog/digital converter (AD) is capable of converting.

2. The circuit arrangement of claim 1, characterized in that the amplifier is an operational amplifier (OP), and that a transistor (TR) is connected as a collector circuit to the output of the operational amplifier (OP) and limits the rise of the output voltage of the operational amplifier (OP) to the voltage range that the analog/digital converter (AD) is capable of converting.

* * * * *